US010389270B2

(12) United States Patent
Sun et al.

(10) Patent No.: US 10,389,270 B2
(45) Date of Patent: Aug. 20, 2019

(54) POWER CONVERSION DEVICE

(71) Applicant: Delta Electronics (Thailand) Public Company Limited, Samutprakarn (TH)

(72) Inventors: Jia Sun, Samutprakarn (TH); Junlai Huang, Samutprakarn (TH); Xuanshun Qi, Samutprakarn (TH); Kai Dong, Samutprakarn (TH); Zhongwei Ke, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 0 days.

(21) Appl. No.: 16/015,128

(22) Filed: Jun. 21, 2018

(65) Prior Publication Data

US 2019/0058415 A1 Feb. 21, 2019

(30) Foreign Application Priority Data

Aug. 15, 2017 (CN) .......................... 2017 1 0696374

(51) Int. Cl.

*H02M 7/48* (2007.01)
*H02M 7/00* (2006.01)
*H05K 1/02* (2006.01)
*H02M 1/44* (2007.01)
*H02M 1/32* (2007.01)

(52) U.S. Cl.

CPC ............... *H02M 7/48* (2013.01); *H02M 1/44* (2013.01); *H02M 7/003* (2013.01); *H05K 1/0231* (2013.01); *H02M 1/32* (2013.01); *H02M 2001/327* (2013.01); *H02M 2007/4803* (2013.01)

(58) Field of Classification Search

CPC .......... H02M 7/48; H02M 7/003; H02M 1/44; H02M 1/0231; H02M 2007/4803
See application file for complete search history.

(56) References Cited

U.S. PATENT DOCUMENTS

2010/0202109 A1* 8/2010 Zheng .................. H02M 7/003 361/697
2017/0244335 A1* 8/2017 Lim ..................... H02M 7/003
2018/0062415 A1* 3/2018 Chen .................... H02J 7/0021

FOREIGN PATENT DOCUMENTS

CN 203933424 U 11/2014
CN 204349813 U 5/2015
CN 105099131 A 11/2015

* cited by examiner

*Primary Examiner* — Jue Zhang
(74) *Attorney, Agent, or Firm* — Kirton McConkie; Evan R. Witt

(57) ABSTRACT

A power conversion device includes a main board, a connector module, an input conversion module, a capacitor, an output conversion module, a control module and a conducting part. The main board includes two lateral edges along a first direction and two lateral edges along a second direction. The connector module is mounted on the main board, and includes an input connector and an output connector. The output connector is located under the input connector. The input conversion module, the output conversion module and the control module are perpendicularly mounted on the main board. The conducting part is in parallel with the control module and electrically coupled with the input connector or the output connector. The connector module, the input conversion module, the capacitor and the output conversion module are mounted on the main board and arranged in a line along the second direction.

26 Claims, 12 Drawing Sheets

POWER CONVERSION DEVICE

CROSS-REFERENCE TO RELATED APPLICATION

This application claims priority to China Patent Application No. 201710696374.5 filed on Aug. 15, 2017, the entire contents of which are incorporated herein by reference for all purposes.

FIELD OF THE INVENTION

The present invention relates to a power conversion device.

BACKGROUND OF THE INVENTION

Nowadays, the servers need more and more power to meet data process requirement. In the server industry, a power system usually comprises a power rack and plural power conversion devices. The power conversion devices are installed in the power rack and are connected with each other in series or in parallel to provide power to other electronic devices. To increase the output power of the power system with same size, there are two ways, one is to increase output power of each power conversion device, the other is to increase number of power conversion devices. Increasing output power of power conversion devices is usually limited by conditions of input AC connectors, input fusing and datacenter facility. So it is a typical way to design same power with smaller width of the power conversion devices.

However, the conventional power conversion device still has some drawbacks. For example, some components of the conventional power conversion device are horizontally installed on a main board. Some components are not regularly arranged on the main board. Since the positions of the components are not centralized, the overall volume of the power conversion device is bulky and the width reduction of the power conversion device is limited. Moreover, the input connector and the output connector of the conventional power conversion device are separately installed on different positions of the main board. The purpose of reducing the width of the power conversion device cannot be achieved easily.

Therefore, there is a need of providing an improved power conversion device in order to overcome the above drawbacks.

SUMMARY OF THE INVENTION

An object of the present invention provides a power conversion device. Some components are modularized and perpendicularly mounted on a main board, and the positions of some components are specifically arranged. Consequently, the width of the power conversion device is reduced.

In accordance with an aspect of the present application, there is provided a power conversion device. The power conversion device includes a main board, a connector module, an input conversion module, a capacitor, an output conversion module, a control module and a conducting part. The main board includes a first edge, a second edge, a third edge and a fourth edge. The first edge and the second edge are in parallel with a first direction and opposed to each other. The third edge and the fourth edge are arranged between the first edge and the second edge. The third edge and the fourth edge are in parallel with a second direction and opposed to each other. The connector module is mounted on the main board, which comprises an input connector and an output connector. The output connector is stacked under the input connector. The input conversion module is perpendicularly mounted on the main board. The capacitor is mounted on the main board. The output conversion module is perpendicularly mounted on the main board. The connector module, the input conversion module, the capacitor and the output conversion module are arranged in a line along the second direction. The control module is perpendicularly mounted on the main board. The control module is located near the fourth edge and in parallel with the fourth edge. The conducting part is mounted on the main board. The conducting part is in parallel with the control module and electrically coupled with the input connector or the output connector.

The above contents of the present invention will become more readily apparent to those ordinarily skilled in the art after reviewing the following detailed description and accompanying drawings, in which:

DETAILED DESCRIPTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
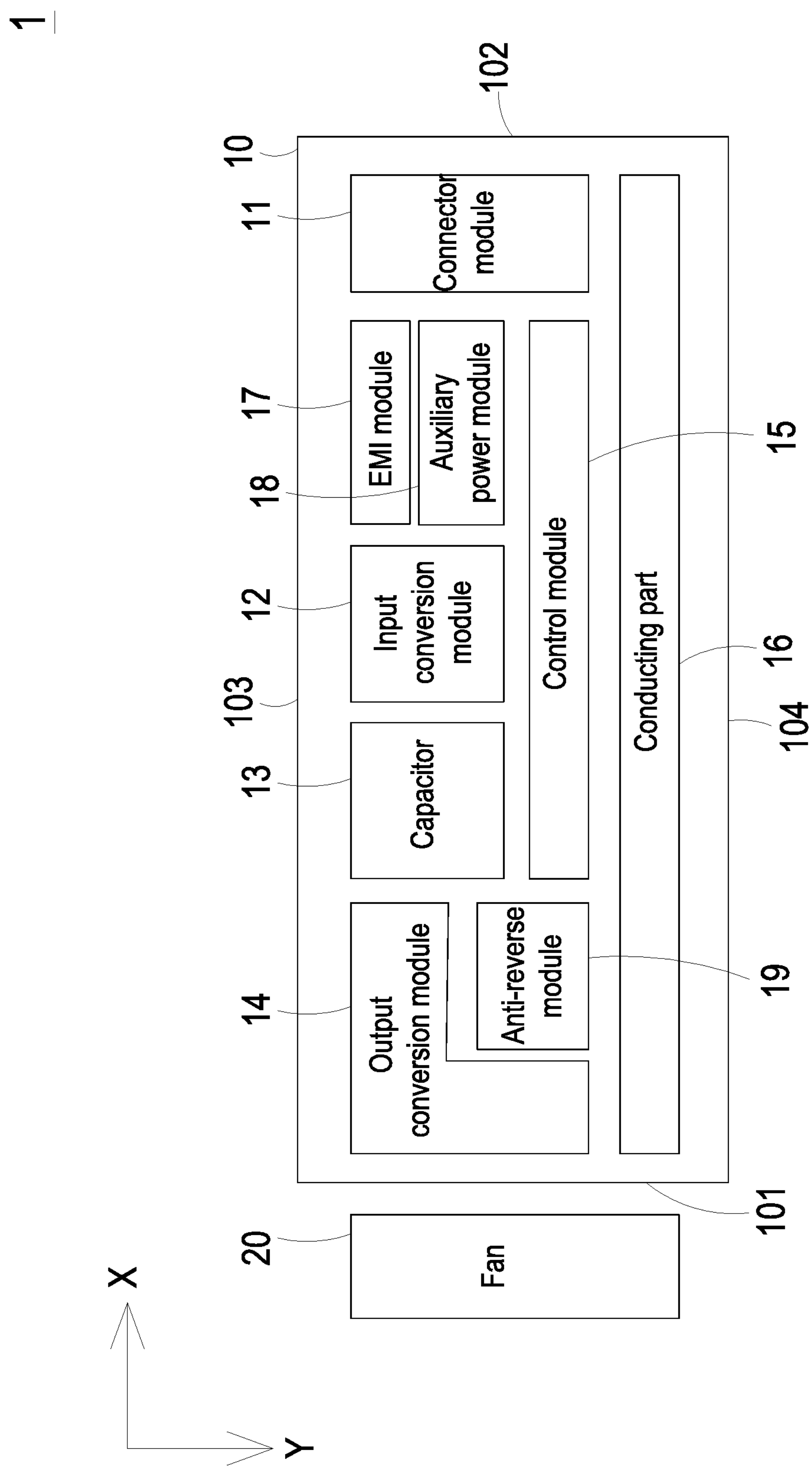
FIG. 1 is a schematic block diagram illustrating a layout structure of a power conversion device according to a first embodiment of the present application.
Figure 2:
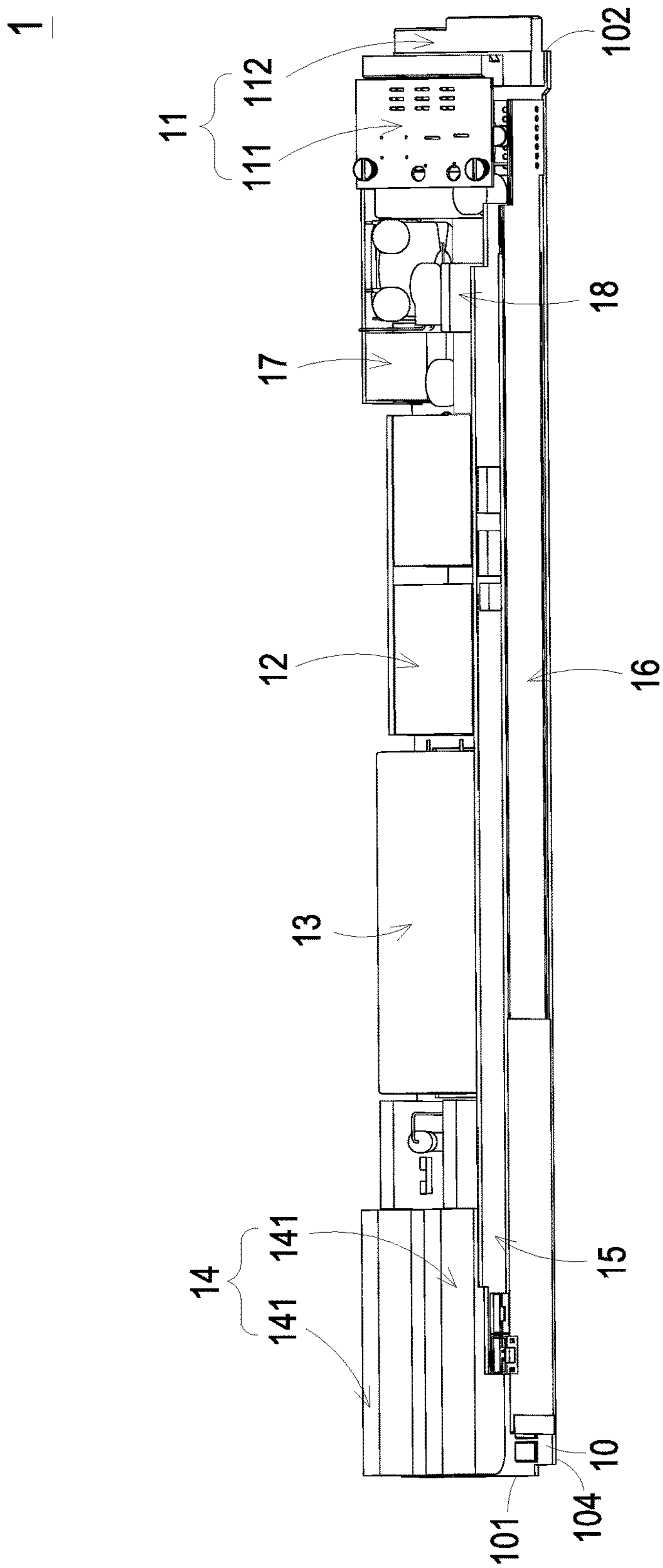
FIG. 2 is a schematic perspective view illustrating a portion of the power conversion device according to the first embodiment of the present application.
Figure 3:
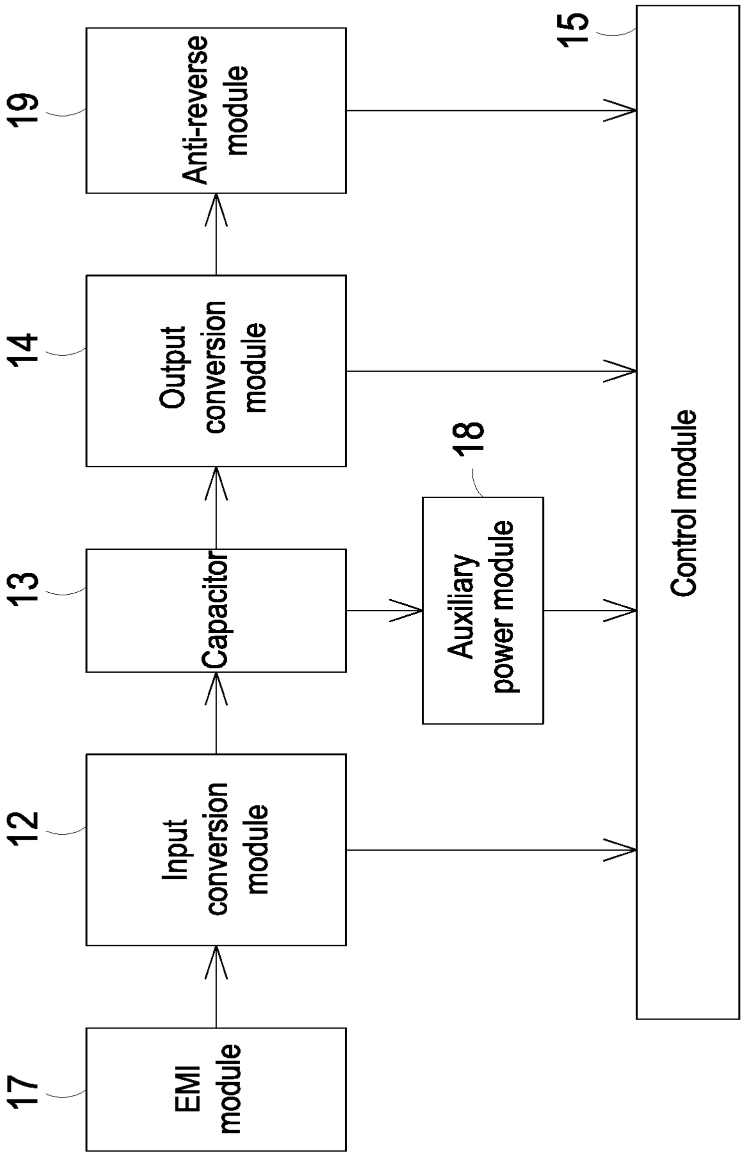
FIG. 3 is a schematic circuit block diagram illustrating the power conversion device according to the first embodiment of the present application.
Figure 4:
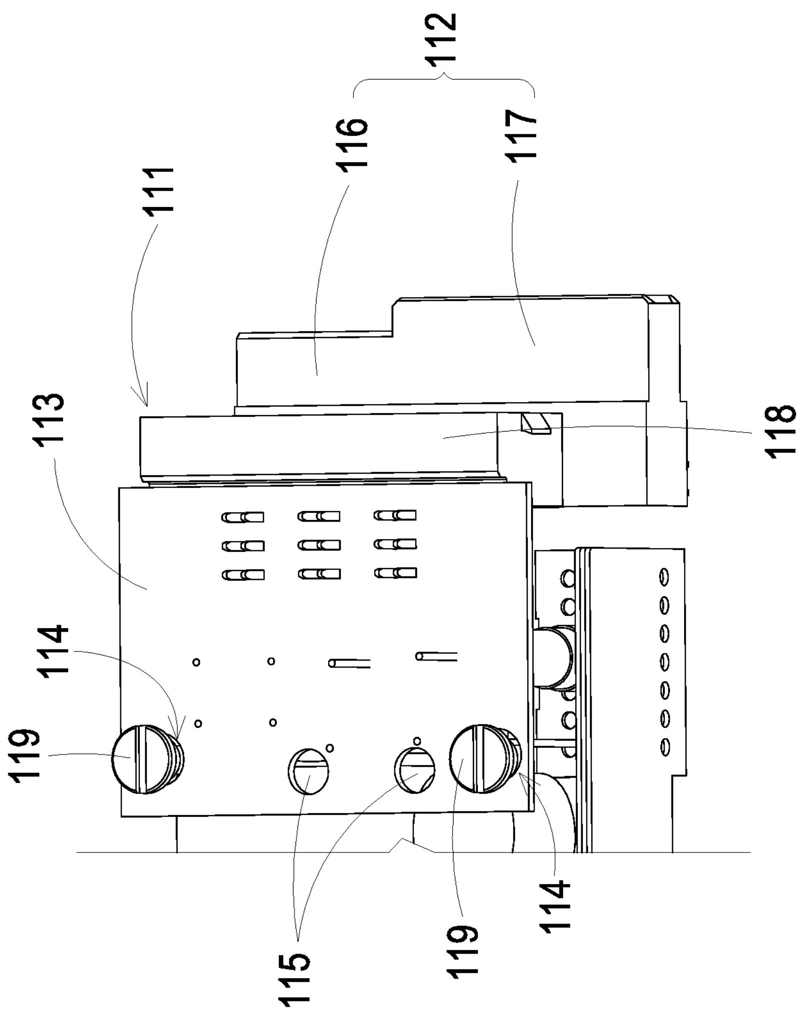
FIG. 4 is a schematic perspective view illustrating the connector module of the power conversion device according to the first embodiment of the present application.
Figure 5:
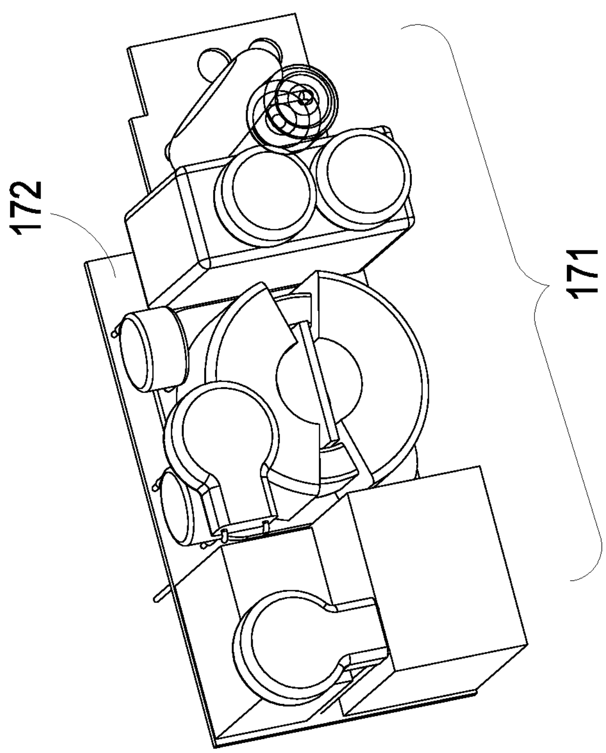
FIG. 5 is a schematic perspective view illustrating the EMI module of the power conversion device according to the first embodiment of the present application.
Figure 6:
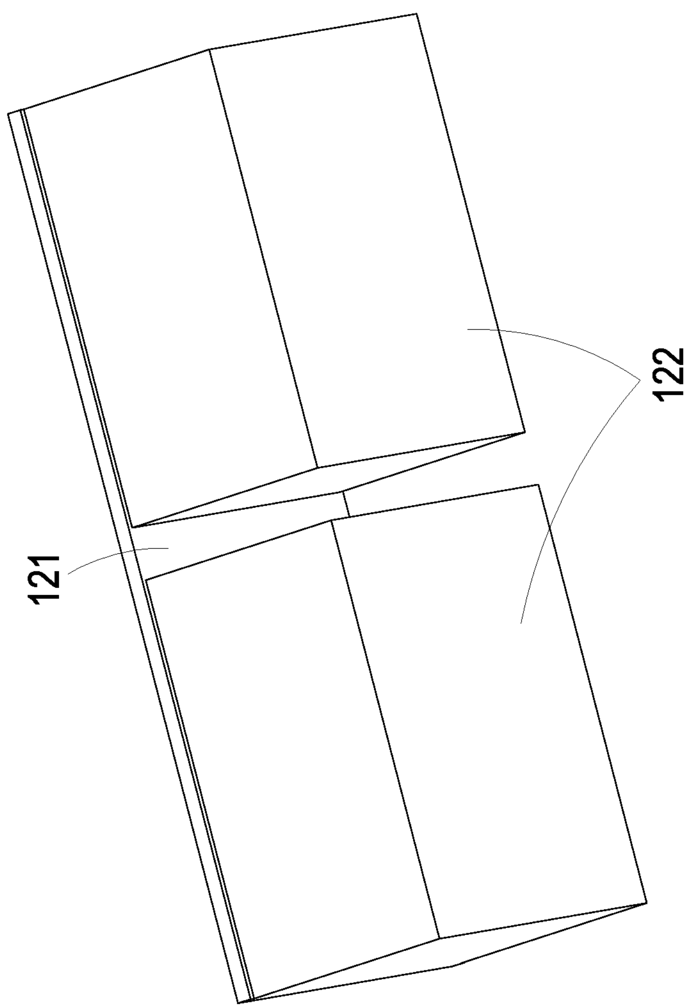
FIG. 6 is a schematic perspective view illustrating the input conversion module of the power conversion device according to the first embodiment of the present application.
Figure 7:
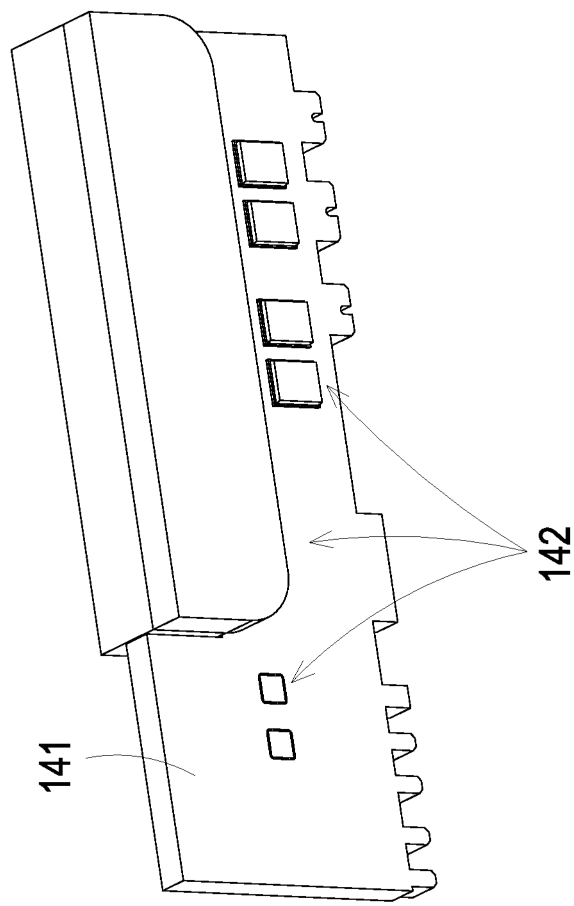
FIG. 7 is a schematic perspective view illustrating the output conversion module of the power conversion device according to the first embodiment of the present application.
Figure 8:
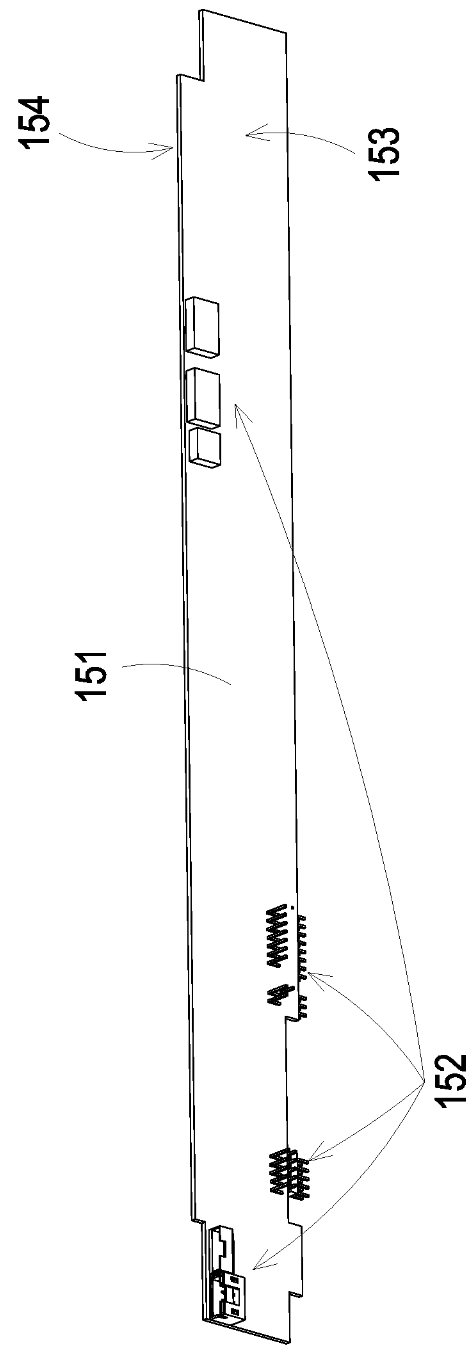
FIG. 8 is a schematic perspective view illustrating the control module of the power conversion device according to the first embodiment of the present application.
Figure 9:
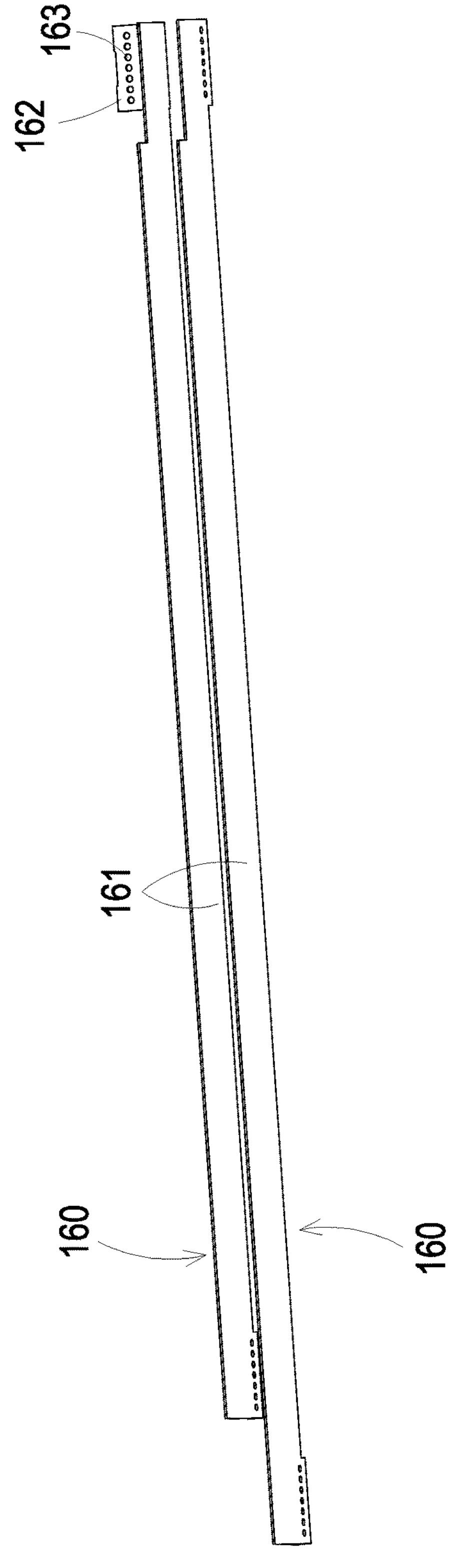
FIG. 9 is a schematic perspective view illustrating the conducting part of the power conversion device according to the first embodiment of the present application.
Figure 10:
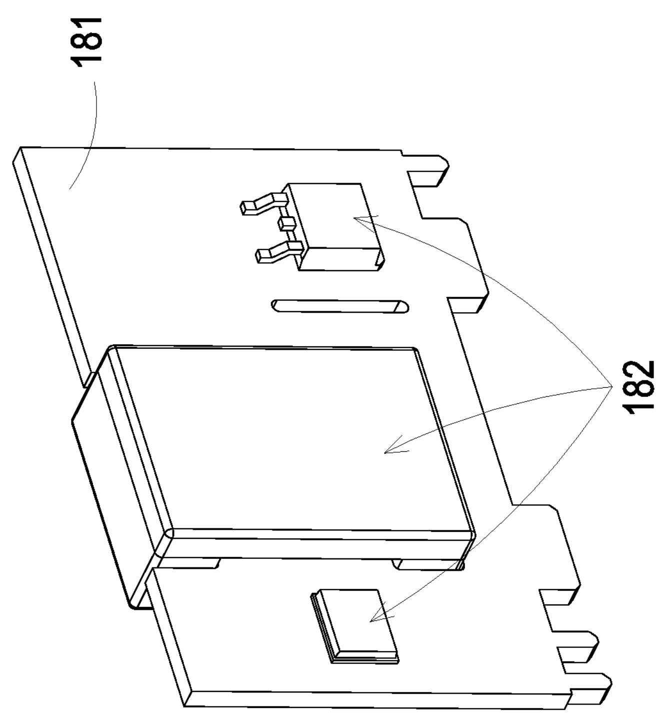
FIG. 10 is a schematic perspective view illustrating the auxiliary power module of the power conversion device according to the first embodiment of the present application.

Referring to FIG. 1 to FIG. 3, the power conversion device 1 is applied to a communication power system, and not limited to an AC/DC power converter. An example of the power conversion device 1 comprises a DC/DC power converter, or an AC&DC/DC power converter. Moreover, the power conversion device 1 is enclosed by a casing (not shown) and mounted in a power rack (not shown). In this embodiment, the power conversion device 1 comprises a main board 10, a connector module 11, an input conversion module 12, a capacitor 13, an output conversion module 14, a control module 15 and a conducting part 16.

The main board 10 comprises a first edge 101, a second edge 102, a third edge 103 and a fourth edge 104. The first edge 101 and the second edge 102 are in parallel with a first direction Y (i.e., the width direction of the power conversion device 1) and opposed to each other. The third edge 103 and the fourth edge 104 are arranged between the first edge 101 and the second edge 102. The third edge 103 and the fourth edge 104 are in parallel with a second direction X (i.e., the length direction of the power conversion device 1) and opposed to each other.

The connector module 11 is mounted on the main board 10 and located near the second edge 102. The connector module 11 comprises an input connector 111 and an output connector 112. The input connector 111 is separately and electrically coupled with an input power source (not shown) to receive an input power (e.g., an AC input power) from the input power source. The output connector 112 is stacked under the input connector 111, and separately and electrically coupled with a load (not shown) to provide an output power (e.g., an output DC power) to the load.

The input conversion module 12 is perpendicularly mounted on the main board 10 and located near the third edge 103. By the input conversion module 12, the AC input power from the input connector 111 is converted into a transition DC power.

The capacitor 13 is mounted on the main board 10 and located near the input conversion module 12 and the third edge 103. Moreover, the capacitor 13 is arranged between the input conversion module 12 and the output conversion module 14. The capacitor 13 is electrically coupled with the input conversion module 12. The capacitor 13 is used for stabilizing the transition DC power and reducing the ripple current of the transition DC power. Besides, the diameter of the capacitor 13 is smaller than or equal to 35 mm.

The output conversion module 14 is perpendicularly mounted on the main board 10 and located near the capacitor 13 and the third edge 103. Moreover, the output conversion module 14 is arranged between the capacitor 13 and the first edge 101. The output conversion module 14 is electrically coupled with the capacitor 13. By the output conversion module 14, the stabilized transition DC power from the capacitor 13 is converted into the output DC power.

The control module 15 is perpendicularly mounted on the main board 10. Moreover, the control module 15 is located near the fourth edge 104 and in parallel with the fourth edge 104. The control module 15 is electrically coupled with the input conversion module 12 and the output conversion module 14. The control module 15 is used for monitoring and controlling the operations of the power conversion device 1. For example, the control module 15 is used for sampling the input voltage and the input current of the power conversion device 1, sampling the output voltage and the output current of the power conversion device 1, or detecting the internal temperature of the power conversion device 1.

The conducting part 16 is mounted on the main board 10. Moreover, the conducting part 16 is in parallel with the control module 15, and arranged between the control module 15 and the fourth edge 104. The conducting part 16 is electrically coupled with the output connector 112 and the output conversion module 14. The output power from the output conversion module 14 is transmitted to the output connector 112 of the connector module 11 through the conducting part 16.

Referring to FIGS. 1 and 2, the connector module 11, the input conversion module 12, the capacitor 13 and the output conversion module 14 are mounted on the main board 10 and arranged in a line along the second direction X. For installing more power conversion devices 1 in the power rack, it is necessary to reduce the width of the power conversion device 1. The width of the power conversion device 1 in the first direction Y is smaller than a predetermined value (e.g., 60 mm). For example, the width of the power conversion device 1 in the first direction Y is between 35 mm and 55 mm. Further, the width of the power conversion device 1 in the first direction Y is 40 mm, 45 mm or 54 mm.

As mentioned above, the input conversion module 12, the output conversion module 14 and the control module 15 are perpendicularly mounted on the main board 10. Consequently, the space of the main board 10 in the width direction is saved. That is, the space between the third edge 103 and the fourth edge 104 is saved. Moreover, the connector module 11, the input conversion module 12, the capacitor 13 and the output conversion module 14 are mounted on the main board 10 and arranged in a line along the second direction X. That is, the positions of these components are centralized. Since the space between the third edge 103 and the fourth edge 104 is further saved, the purpose of reducing the width of the power conversion device 1 is achieved. In addition, the input connector 111 and the output connector 112 of the connector module 11 are arranged in a stack form and mounted on the main board 10. Since the input connector 111 and the output connector 112 are not staggered, the space of the main board 10 in the width direction is further saved. Because of the above features, the overall width of the power conversion device 1 is reduced, and more power conversion devices 1 can be mounted in the power rack under the condition of fixed width of the power rack.

In an embodiment, the power conversion device 1 further comprises an EMI module 17 and an auxiliary power module 18. The EMI module 17 is perpendicularly mounted on the main board 10 and located near the third edge 103. Moreover, the EMI module 17 is arranged between the connector module 11 and the input conversion module 12. In other words, the input conversion module 12 is arranged between the EMI module 17 and the capacitor 13. The EMI module 17 is electrically coupled with the input connector 111 of the connector module 11 and the input conversion module 12. The EMI module 17 is used for filtering the input power from the input connector 111 of the connector module 11 and avoiding electromagnetic interference. The auxiliary power module 18 is perpendicularly mounted on the main board 10 and in parallel with the EMI module 17. Moreover, the auxiliary power module 18 is arranged between the connector module 11 and the input conversion module 12 and located near the EMI module 17. The auxiliary power module 18 is electrically coupled with the capacitor 13 and the control module 15. After the stabilized transition DC power from the capacitor 13 is converted by the auxiliary power module 18, the converted power is transmitted to the control module 15 in an isolation manner so as to drive the control module 15. Moreover, the voltage and the current outputted from the auxiliary power module 18 may be detected by the control module 15.

In an embodiment, the power conversion device 1 further comprises an anti-reverse module 19. The anti-reverse module 19 is mounted on the main board 10. Moreover, the anti-reverse module 19 is arranged between at least a part of the output conversion module 14 and the fourth edge 104. The anti-reverse module 19 is used for preventing the output power of the power conversion device 1 from returning back to the power conversion device 1. In an embodiment, the anti-reverse module 19 comprises a switching element (not shown) and a controlling circuit (not shown). The anti-reverse module 19 is electrically coupled between the output terminal of the output conversion module 14 and the load. Consequently, the output power is only allowed to be transmitted from the output conversion module 14 to the load.

In an embodiment, the power conversion device 1 further comprises a fan 20. The fan 20 is located near the first edge 101 and fixed on the casing. The fan 20 is used for producing airflow to remove the heat from the power conversion device 1. The rotating speed of the fan 20 is controlled by the control module 15. For example, but not exclusively, the voltage of the output power from the power conversion device 1 is 54V or 48V.

In some embodiments, heat dissipation channels are arranged between the connector module 11, the EMI module 17, the auxiliary power module 18, the input conversion module 12, the capacitor 13, the output conversion module 14, the control module 15 and the conducting part 16. The airflow produced by the fan 20 can flow through the channels to remove the heat from the corresponding components. Consequently, the heat generated by the components of the power conversion device 1 can be effectively dissipated.

Referring to FIGS. 1 and 2, the power conversion device 1 transfers power from the input connector 111 to the output connector 112 through the EMI module 17, the input conversion module 12, the capacitor 13, the output conversion module 14 and the conducting part 16 sequentially. In an embodiment, the input connector 111 and the output connector 112 are located at the same side of the main board 10. The input terminal of the input connector 111 is in a floating state. For example, a first end of a mechanism part is locked with input connector 111 through the screw hole, and a second end of the mechanism part is tightened into the casing through the screw. Wherein, the size of the screw hole is relatively large, so the screw is in a floating state. The input connector 111 in the floating state can provide buffering efficacy to the input terminal. Consequently, the input terminal can be plugged into the corresponding device (e.g., the external power source) more easily. If the input terminal of the input connector 111 and the output terminal of the output connector 112 are fixed, the tolerance is increased. Under this circumstance, it is difficult for the input terminal and the output terminal to be plugged into the corresponding client devices. Besides, the transition DC power from the input conversion module 12 is filtered by the capacitor 13, and the filtered power is converted by the auxiliary power module 18 and transmitted to the control module 15 in an isolation manner.

The structures of the components of the power conversion device 1 will be described as follows. Referring to FIGS. 1, 2, 3 and 4, the input connector 111 of the connector module 11 comprises an input plate 113 and at least one input terminal 118 coupled with the input plate 113. The input plate 113 comprises at least one screw hole 114 and at least one wire hole 115. A first end of a screw 119 is locked in the screw hole 114. A second end of the screw 119 is penetrated through the screw hole 114 and tightened into the casing. Moreover, the size of the screw hole 114 is larger than the size of the second end of the screw 119. When the second end of the screw 119 is partially accommodated within the screw hole 114, a gap can be formed between the second end of the screw 119 and the input plate 113. Consequently, the input plate 113 may be floated relative to the casing when the screw 119 is fastened on the casing. The input plate 113 in the floating state can provide buffering efficacy to the input terminal 118 on the input plate 113. Consequently, the input terminal 118 can be plugged into the corresponding device more easily. Under this circumstance, the input terminal 118 can be plugged into the corresponding device without being influenced by the production tolerance. An end of a jumper wire (not shown) is coupled with the wire hole 115. Another end of the jumper wire is coupled with the EMI module 17. Consequently, the input terminal 118 is electrically coupled with the EMI module 17 through the input plate 113 and the jumper wire. The output connector 112 is located under the input connector 111. The output connector 112 comprises at least one output power terminal 116 and at least one signal terminal 117 in a staggered manner. The output power terminal 116 is used for transferring the output power of the power conversion device 1. The signal terminal 117 is used for transferring signals of the power conversion device 1. Consequently, different types and levels of output signals (e.g., power signal and control signal) are outputted from different types of terminals. Moreover, since the output connector 112 is located under the input connector 111, the use of the jumper wire for the output connector 112 is reduced. Under this circumstance, the interference and the cost are both reduced.

Referring to FIGS. 1, 2, 3 and 5, the EMI module 17 comprises an EMI component 171 and an EMI circuit board 172. The EMI circuit board 172 is perpendicularly mounted on the main board 10. The EMI component 171 is disposed on the EMI circuit board 172. The EMI component 171 comprises a fuse, a differential mode capacitor, a common mode capacitor and a common mode inductor (not shown). In some embodiments, the EMI circuit board 172 is electrically coupled with the casing through a spring strip (not shown) or a screw (not shown). Consequently, the EMI circuit board 172 has grounding efficacy.

Referring to FIGS. 1, 2, 3 and 6, the input conversion module 12 comprises a second circuit board 121 and a second integrated component 122. The second circuit board 121 is perpendicularly mounted on the main board 10. The second integrated component 122 is disposed on the second circuit board 121. The second integrated component 122 comprises at least one power component and an inductor (not shown). In case that the input conversion module 12 is operated at a high frequency, the volume of the inductor in the input conversion module 12 is reduced. In case that the power component of the second integrated component 122 uses a soft switching mechanism, the switching loss is reduced. Consequently, the efficiency of the power conversion device 1 is enhanced. In addition, the second integrated component 122 is disposed on a first surface of the second circuit board 121, and a heat sink (not shown) is disposed on a second surface of the second circuit board 121 to remove the heat from the input conversion module 12.

Referring to FIGS. 1, 2, 3 and 7, the output conversion module 14 comprises at least one output power board 141 and at least one third integrated component 142. The output power board 141 is perpendicularly mounted on the main board 10. The third integrated component 142 is disposed on the output power board 141. Besides, the third integrated component 142 comprises a DC/DC conversion circuit with a transformer and an inductor and an output filtering circuit. For succinctness, these components are not shown. Wherein, the transformer and the inductor of the DC/DC conversion circuit are formed as a magnetic element through PCB windings. In the embodiment as shown in FIG. 2, the output conversion module 14 comprises two output power boards 141 and two third integrated components 142. The two output power boards 141 are separately mounted on the main board 10 and in parallel with each other, and each third integrated component 142 is disposed on the respective output power board 141. Moreover, the output terminals of the output filtering circuits of the two third integrated components 142 are coupled with each other in parallel.

Referring to FIGS. 1, 2, 3 and 8, the control module 15 comprises a control circuit board 151 and a fourth integrated component 152. The control circuit board 151 is perpendicularly mounted on the main board 10. The control circuit board 151 has a first surface 153 and a second surface 154, which are opposed to each other. The fourth integrated component 152 is disposed on the first surface 153 of the control circuit board 151. In some embodiments, the fourth integrated component 152 comprises a resistor array, a capacitor array, a microcontroller, a sampling circuit, a detecting circuit and a communicating circuit. For succinctness, these components are not shown. Since the fourth integrated component 152 is disposed on the first surface 153 of the control circuit board 151, the thickness of the control module 15 is reduced. Moreover, since the control module 15 is perpendicularly mounted on the main board 10, the space of the main board 10 in the width direction is saved. Besides, no component is disposed on the second surface 154 of the control circuit board 151. In another embodiment, a shielding layer (not shown) is formed on the second surface 154 to protect the control circuit board 151 of the control module 15.

Referring to FIGS. 1, 2, 3 and 9, the conducting part 16 comprises two pieces of conductive plates 160 parallel to each other to reduce the parasitic inductance between the two parallel conductive plates 160. The two conductive plates 160 are also in parallel with the control module 15. Each conductive plate 160 comprises a first portion 161 and a second portion 162 vertical to the first portion 161. A first end of the first portion 161 is coupled with the output conversion module 14, and a second end of the first portion 161 is coupled with the output connector 112. The second portion 162 is in parallel with the main board 10. Moreover, the second portion 162 comprises a plurality of insertion terminals 163. The plurality of insertion terminals 163 are protruded from the second portion 162 in the direction toward the main board 10, and perpendicularly inserted into the main board 10. For example, the conductive plates 160 are copper bars, and the output voltage of the power conversion device 1 is 54V/48V.

Referring to FIGS. 1, 2, 3 and 10, the auxiliary power module 18 comprises a first circuit board 181 and a first integrated component 182. The first circuit board 181 is perpendicularly mounted on the main board 10, and in parallel with the conducting part 16. The first integrated component 182 is disposed on the first circuit board 181, and comprises a power element (not shown) and a planar transformer (not shown). Besides, a heat dissipation channel is arranged between the first circuit board 181 of the auxiliary power module 18 and the EMI circuit board 172 of the EMI module 17. Due to the heat dissipation channel, the distance between the common module inductor of the EMI module 17 and the planar transformer of the first integrated component 182 of the auxiliary power module 18 is large. Consequently, the coupling between the above two magnetic elements is reduced, and the electromagnetic interference is reduced. In some embodiments, the thickness of the auxiliary power module 18 is smaller than 10 mm.

As mentioned above, the second integrated component 122 of the input conversion module 12 comprises at least one power component and an inductor (not shown). The third integrated component 142 of the output conversion module 14 comprises a DC/DC conversion circuit and an output filtering circuit. The fourth integrated component 152 of the control module 15 comprises a resistor array, a capacitor array, a microcontroller, a sampling circuit, a detecting circuit and a communicating circuit. The EMI component 171 of the EMI module 17 comprises a fuse, a differential mode capacitor, a common mode capacitor and a common mode inductor. The first integrated component 182 of the auxiliary power module 18 comprises a power element (not shown) and a planar transformer. In other words, the input conversion module 12, the output conversion module 14, the control module 15, the EMI module 17 and the auxiliary power module 18 are modularized. In comparison with the conventional power conversion device with individual components, the space of the main board 10 of the power conversion device 1 in the width direction is saved.

Figure 11:
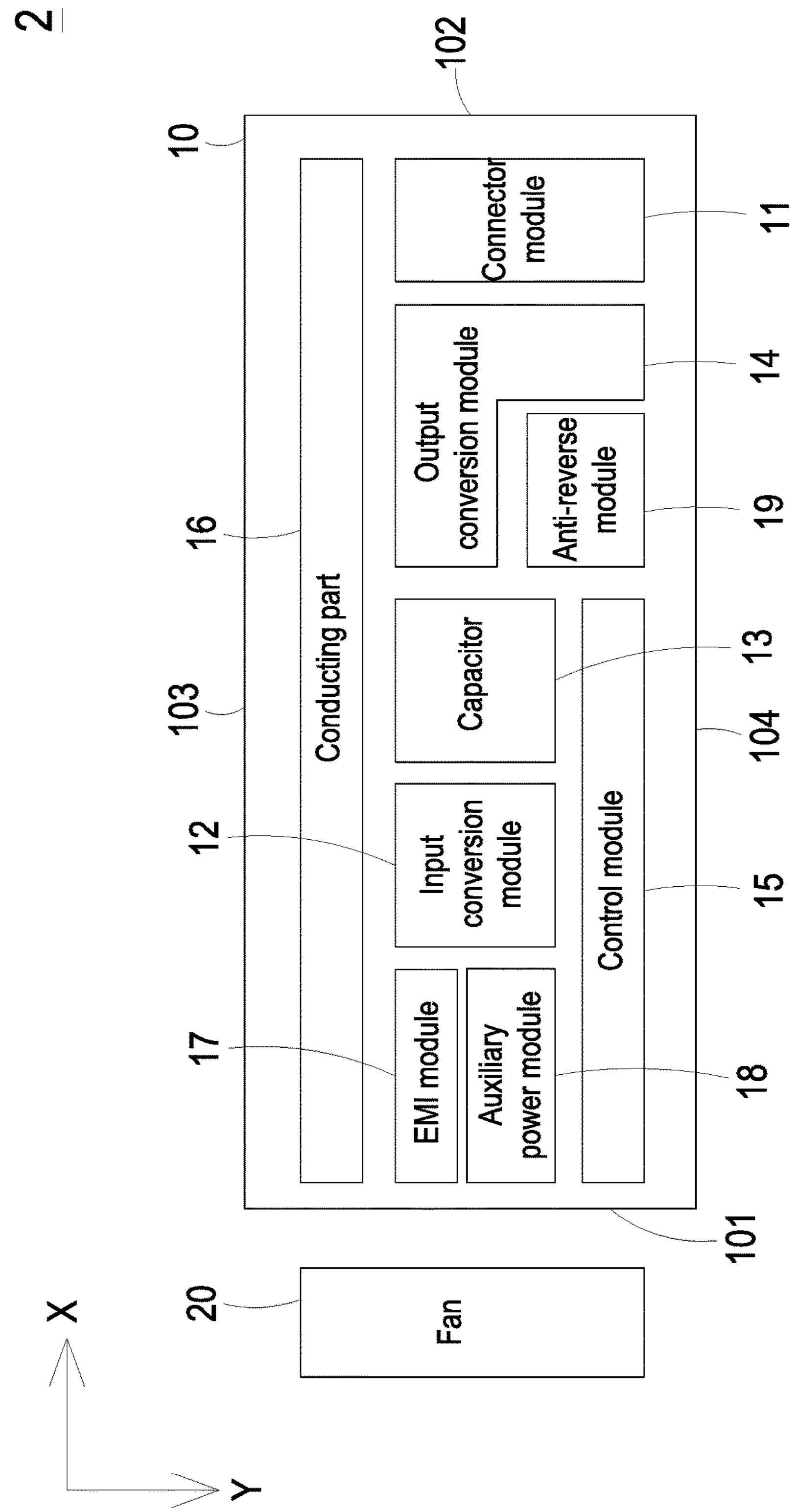
FIG. 11 is a schematic block diagram illustrating a layout structure of a power conversion device according to a second embodiment of the present application.
Figure 12:
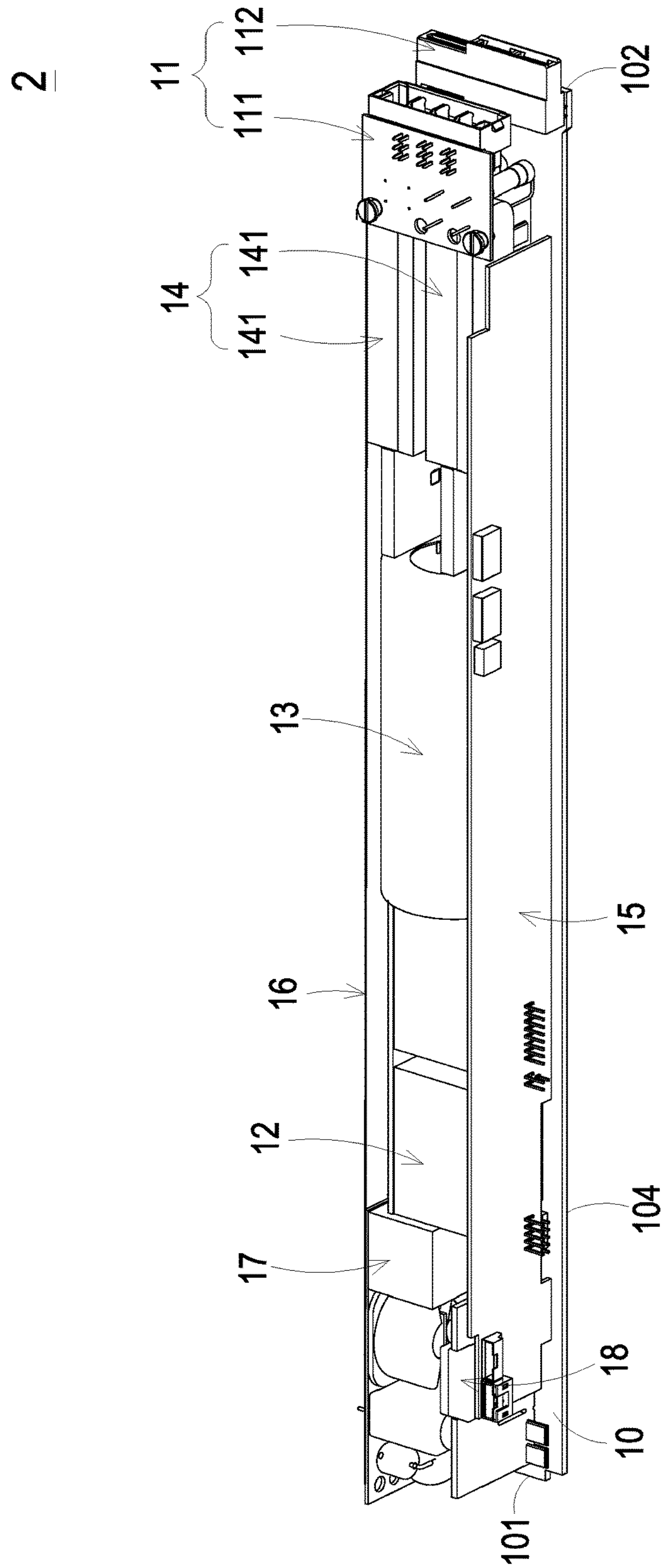
FIG. 12 is a schematic perspective view illustrating a portion of the power conversion device according to the second embodiment of the present application.

In some other embodiments, the conducting part 16 is a flying wire, and the layout structure of the power conversion device is correspondingly changed. FIG. 11 is a schematic block diagram illustrating a layout structure of a power conversion device according to a second embodiment of the present invention. FIG. 12 is a schematic perspective view illustrating a portion of the power conversion device according to the second embodiment of the present invention. Component parts and elements corresponding to those of the first embodiment are designated by identical numeral references, and detailed descriptions thereof are omitted.

In this embodiment, the conducting part 16 is mounted on the main board 10. Moreover, the conducting part 16 is located near the third edge 103 and in parallel with the third edge 103. The conducting part 16 is electrically coupled with the EMI module 17 and the input connector 111 of the connector module 11. Consequently, the input power received by the input connector 111 at the rightmost side of the main board 10 can be transmitted to the EMI module 17 at the leftmost side of the main board 10 through the conducting part 16. The output conversion module 14 is perpendicularly mounted on the main board 10. Moreover, the output conversion module 14 is arranged between the conducting part 16 and the fourth edge 104, and arranged between the connector module 11 and the capacitor 13. The control module 15 is perpendicularly mounted on the main board 10. Moreover, the control module 15 is located near and in parallel with the fourth edge 104. The capacitor 13 is mounted on the main board 10. Moreover, the capacitor 13 is arranged between the output conversion module 14 and the input conversion module 12, and arranged between the conducting part 16 and the control module 15. The input conversion module 12 is perpendicularly mounted on the main board 10. Moreover, the input conversion module 12 is arranged between the capacitor 13 and the EMI module 17, and arranged between the conducting part 16 and the control module 15. The EMI module 17 is perpendicularly mounted on the main board 10. Moreover, the EMI module 17 is located near the conducting part 16 and arranged between the input conversion module 12 and the first edge 101. The auxiliary power module 18 and the EMI module 17 are in parallel with each other and mounted on the main board 10. Moreover, the auxiliary power module 18 is arranged between the EMI module 17 and the control module 15, and arranged between the input conversion module 12 and the first edge 101. The anti-reverse module 19 is mounted on the main board 10. Moreover, the anti-reverse module 19 is arranged between the output conversion module 14 and the fourth edge 104, and the anti-reverse module 19 is arranged between at least a part of the input conversion module 12 and the capacitor 13.

In this embodiment, the input conversion module 12, the capacitor 13, the output conversion module 14 and the connector module 11 are mounted on the main board 10 and arranged in a line along the second direction X. Referring to FIG. 11, the power conversion device 2 transfers power from the input connector 111 to the output connector 112 through the conducting part 16, the EMI module 17, the input conversion module 12, the capacitor 13 and the output conversion module 14 sequentially. In this embodiment, the output voltage of the power conversion device 2 is 12V. Similarly, the power conversion device 2 can be applied to condition of large current. Besides, the conducting part 16 can be the conducting line, and the conducting line comprises two metal lines (e.g., cooper line) or the conducting line is a bus bar.

From the above descriptions, the present invention provides the power conversion device. The input conversion module, the output conversion module and the control module are perpendicularly mounted on the main board. The connector module, the input conversion module, the capacitor and the output conversion module are mounted on the main board and arranged in a line along the length direction. The input connector and the output connector of the connector module are arranged in a stack form and mounted on the main board. Consequently, the overall width of the power conversion device is reduced. Even if the width of the power rack is fixed, more power conversion devices can be mounted in the power rack.

While the invention has been described in terms of what is presently considered to be the most practical and preferred embodiments, it is to be understood that the invention needs not be limited to the disclosed embodiments. On the contrary, it is intended to cover various modifications and similar arrangements comprised within the spirit and scope of the appended claims which are to be accorded with the broadest interpretation so as to encompass all such modifications and similar structures.

What is claimed is:

1. A power conversion device, comprising:

a main board comprising a first edge, a second edge, a third edge and a fourth edge, wherein the first edge and the second edge are in parallel with a first direction and opposed to each other, the third edge and the fourth edge are arranged between the first edge and the second edge, and the third edge and the fourth edge are in parallel with a second direction and opposed to each other;

a connector module mounted on the main board, which comprises an input connector and an output connector, and the output connector is stacked under the input connector;

an input conversion module perpendicularly mounted on the main board;

a capacitor mounted on the main board;

an output conversion module perpendicularly mounted on the main board, wherein the connector module, the input conversion module, the capacitor and the output conversion module are arranged in a line along the second direction;

a control module perpendicularly mounted on the main board, wherein the control module is located near the fourth edge and in parallel with the fourth edge; and a conducting part mounted on the main board, wherein the conducting part is in parallel with the control module and electrically coupled with the input connector or the output connector.

2. The power conversion device according to claim 1, wherein the width of the power conversion device in the first direction is between 35 mm and 55 mm.

3. The power conversion device according to claim 2, wherein the width of the power conversion device in the first direction is 40 mm, 45 mm or 54 mm.

4. The power conversion device according to claim 1, further comprising:

an electromagnetic interference (EMI) module perpendicularly mounted on the main board; and an auxiliary power module perpendicularly mounted on the main board, wherein the auxiliary power module is in parallel with the EMI module.

5. The power conversion device according to claim 4, wherein the EMI module comprises an EMI component and an EMI circuit board, wherein the EMI circuit board is perpendicularly mounted on the main board, and the EMI component is disposed on the EMI circuit board.

6. The power conversion device according to claim 4, wherein the auxiliary power module comprises a first circuit board and a first integrated component, wherein the first circuit board is perpendicularly mounted on the main board, and the first integrated component is disposed on the first circuit board.

7. The power conversion device according to claim 6, wherein a thickness of the auxiliary power module is smaller than or equal to 10 mm.

8. The power conversion device according to claim 4, wherein the input connector is electrically coupled with the EMI module, and the input connector comprises an input plate and at least one input terminal coupled with the input plate, and the input plate comprises at least one screw hole and at least one wire hole, wherein a first end of a screw is locked in the screw hole, and a second end of the screw is penetrated through the screw hole and tightened into a casing, wherein a first end of a jumper wire is coupled with the wire hole, and a second end of the jumper wire is coupled with the EMI module, and the input terminal is electrically coupled with the EMI module through the input plate and the jumper wire.

9. The power conversion device according to claim 8, wherein a size of the screw hole is larger than a size of the second end of the screw, and the input plate is allowed to be floated relative to the casing.

10. The power conversion device according to claim 4, wherein heat dissipation channels are arranged between the connector module, the EMI module, the auxiliary power module, the input conversion module, the capacitor, the output conversion module, the control module and the conducting part, and the heat dissipation channels allow an airflow flow through.

11. The power conversion device according to claim 4, wherein the conducting part comprises two pieces of conductive plates parallel to each other, and each of the conductive plates comprises a first portion and a second portion vertical to the first portion, wherein a first end of the first portion is coupled with the output conversion module, a second end of the first portion is coupled with the output connector, wherein the second portion is in parallel with the main board, the second portion comprises a plurality of insertion terminals, and the plurality of insertion terminals are protruded toward the main board and perpendicularly mounted on the main board.

12. The power conversion device according to claim 11, wherein the connector module is located near the second edge, and the EMI module and the auxiliary power module are arranged between the connector module and the input conversion module, and the input conversion module is arranged between the EMI module and the capacitor, and the capacitor is arranged between the input conversion module and the output conversion module, and the output conversion module is arranged between the capacitor and the first edge.

13. The power conversion device according to claim 12, wherein the power conversion device transfers power from the input connector to the output connector through the EMI module, the input conversion module, the capacitor, the output conversion module and the conducting part sequentially.

14. The power conversion device according to claim 13, wherein an output voltage of the power conversion device is 54V or 48V.

15. The power conversion device according to claim 4, wherein the conducting part is a flying wire, wherein a first end of the flying wire is coupled with the EMI module, and a second end of the flying wire is coupled with the input connector.

16. The power conversion device according to claim 15, wherein the connector module is located near the second edge, and the output conversion module is arranged between the connector module and the capacitor, and the capacitor is arranged between the output conversion module and the input conversion module, and the input conversion module is arranged between the capacitor and the EMI module, and the EMI module and the auxiliary power module are arranged between the input conversion module and the first edge.

17. The power conversion device according to claim 16, wherein the power conversion device transfers power from the input connector to the output connector through the conducting part, the EMI module, the input conversion module, the capacitor and the output conversion module sequentially.

18. The power conversion device according to claim 17, wherein an output voltage of the power conversion device is 12V.

19. The power conversion device according to claim 1, wherein the output connector comprises at least one output power terminal and at least one signal terminal in a staggered manner.

20. The power conversion device according to claim 1, wherein the input conversion module comprises a second circuit board and a second integrated component, wherein the second circuit board is perpendicularly mounted on the main board, and the second integrated component is disposed on the second circuit board.

21. The power conversion device according to claim 1, wherein a diameter of the capacitor is smaller than or equal to 35 mm.

22. The power conversion device according to claim 1, wherein the output conversion module comprises two output power boards and two third integrated components, wherein the two output power boards are separately mounted on the main board and in parallel with each other, and each third integrated component is disposed on the respective output power board.

23. The power conversion device according to claim 1, wherein the control module comprises a control circuit board and a fourth integrated component, wherein the control circuit board is perpendicularly mounted on the main board, and the fourth integrated component is disposed on the control circuit board.

24. The power conversion device according to claim 1, wherein the power conversion device further comprises an anti-reverse module, wherein the anti-reverse module is mounted on the main board and arranged between the output conversion module and the fourth edge.

25. The power conversion device according to claim 1, wherein the power conversion device further comprises a fan, wherein the fan is located near the first edge and fixed on a casing, and a rotating speed of the fan is controlled by the control module.

26. The power conversion device according to claim 1, wherein the power conversion device is applied to the power source structure having an AC/DC power converter, a DC/DC power converter or an AC&DC/DC power converter.

* * * * *